(12) United States Patent
Kim

(10) Patent No.: US 12,578,392 B2
(45) Date of Patent: Mar. 17, 2026

(54) BATTERY MONITORING DEVICE, BATTERY MONITORING METHOD, BATTERY PACK AND ELECTRIC VEHICLE

(71) Applicant: LG Energy Solution, Ltd., Seoul (KR)

(72) Inventor: Won-Gon Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 390 days.

(21) Appl. No.: 18/030,333

(22) PCT Filed: Sep. 23, 2021

(86) PCT No.: PCT/KR2021/012985
§ 371 (c)(1),
(2) Date: Apr. 5, 2023

(87) PCT Pub. No.: WO2022/085962
PCT Pub. Date: Apr. 28, 2022

(65) Prior Publication Data
US 2023/0375624 A1 Nov. 23, 2023

(30) Foreign Application Priority Data

Oct. 19, 2020 (KR) ........................ 10-2020-0135553

(51) Int. Cl.
*G01R 31/382* (2019.01)
*B60L 58/10* (2019.01)
*G01R 31/396* (2019.01)
*H01M 10/48* (2006.01)

(52) U.S. Cl.
CPC ............ *G01R 31/382* (2019.01); *B60L 58/10* (2019.02); *G01R 31/396* (2019.01);
(Continued)

(58) Field of Classification Search
CPC .. G01R 31/382; G01R 31/396; G01R 31/392; B60L 58/10; B60L 2240/54;
(Continued)

(56) References Cited

U.S. PATENT DOCUMENTS 6,664,000 B1 12/2003 Sonobe
2011/0224928 A1 9/2011 Lin et al.
(Continued)

FOREIGN PATENT DOCUMENTS

CN 102253342 B 2/2015
JP 2001102092 A 4/2001
(Continued)

OTHER PUBLICATIONS

Gu, et al., "Influence Analysis and Optimization of Sampling Frequency on the Accuracy of Model and State-of-Charge Estimation for LiNCM Battery", Energies, 2019, 12, 1205; doi:10.3390/en12071205 www.mdpi.com/journal/energies (Year: 2019).*
(Continued)

*Primary Examiner* — Catherine T. Rastovski
*Assistant Examiner* — Toni D Sauncy
(74) *Attorney, Agent, or Firm* — Lerner David LLP

(57) ABSTRACT

A battery monitoring apparatus for a battery assembly having a housing and a plurality of battery cells which is received in the housing is provided herein. The battery monitoring apparatus includes a first sensor to detect an internal temperature of the housing; a second sensor to detect an internal pressure of the housing; a third sensor to detect an internal gas of the housing; a power circuit to generate an operating voltage using a direct current power of the battery assembly; and a controller to change the first sensor, the second sensor and the third sensor from an idle state to a wake-up state using the operating voltage. The controller monitors an internal abnormality of the battery assembly based on a detection value collected from each sensor in the wake-up state.

13 Claims, 3 Drawing Sheets

(52) U.S. Cl.
CPC ....... *H01M 10/482* (2013.01); *H01M 10/486* (2013.01); *H01M 2200/10* (2013.01); *H01M 2200/20* (2013.01); *H01M 2220/20* (2013.01)

(58) Field of Classification Search
CPC .... B60L 2240/545; B60L 3/0046; B60L 3/04; B60L 3/12; B60L 3/00; H01M 10/482; H01M 10/486; H01M 2200/10; H01M 2200/20; H01M 2220/20; H01M 2010/4271; H01M 2010/4278; H01M 10/42; H01M 10/425; H01M 10/4285; H01M 10/48; Y02E 60/10; Y02T 10/70; H02J 7/00; H02J 7/007; H02J 2207/20; B60Y 2200/91

See application file for complete search history.

(56) References Cited

U.S. PATENT DOCUMENTS

| | | | |
|---|---|---|---|
| 2012/0263982 A1 | 10/2012 | Yasui et al. | |
| 2019/0039458 A1 | 2/2019 | Ryu | |
| 2020/0156475 A1* | 5/2020 | Rahbari Asr | .......... G08B 29/06 |
| 2022/0077710 A1* | 3/2022 | Sung | ................... H02J 7/00032 |

FOREIGN PATENT DOCUMENTS

| | | | | |
|---|---|---|---|---|
| JP | 2012074198 | A | 4/2012 | |
| JP | 2019513339 | A | 5/2019 | |
| JP | 2019175552 | A | 10/2019 | |
| KR | 100522670 | B1 | 12/2005 | |
| KR | 20090064774 | A | 6/2009 | |
| KR | 20120102677 | A | 9/2012 | |
| KR | 101704359 | B1 | 2/2017 | |
| KR | 20170025700 | A | 3/2017 | |
| WO | WO-2021049800 | A1 * | 3/2021 | .......... G01R 31/382 |

OTHER PUBLICATIONS

HAN_WO2021049800_ENGLISH-Translation-Used_for_ Examination (Year: 2020).*

JUNG_KR20090064774A_ENGLISH_Translation_Used_for_ Examination (Year: 2009).*

Banguero, et al., "Diagnosis of a battery energy storage system based on principal component analysis", Renewable Energy 146 (2020) 2438-2449, Available online Aug. 12, 2019. (Year: 2020).*

International Search Report for PCT/KR2021/012985 mailed Jan. 3, 2022, 3 pages.

* cited by examiner

FIG. 3

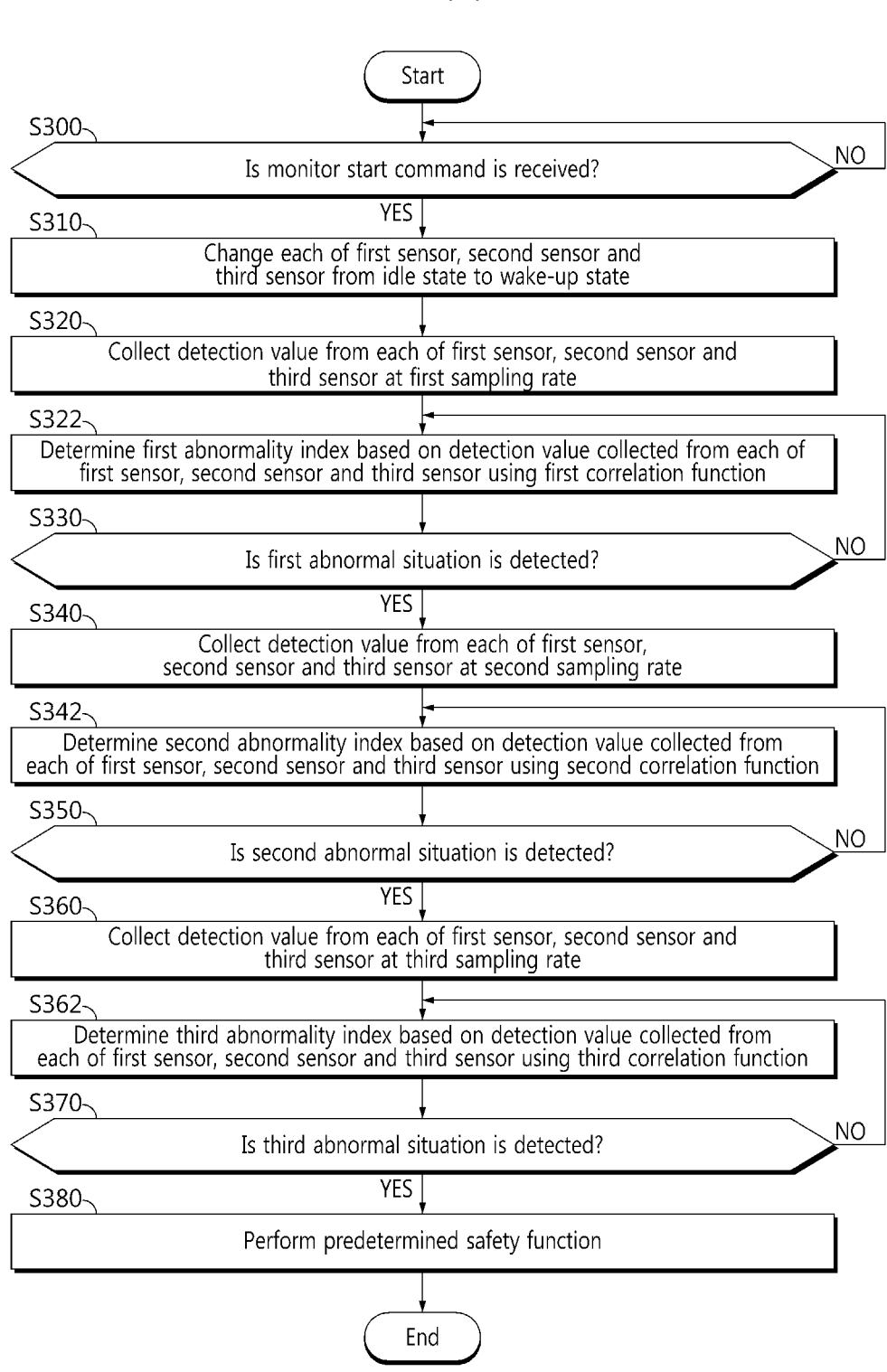

Start

S300 — Is monitor start command is received? — NO

YES

S310 — Change each of first sensor, second sensor and third sensor from idle state to wake-up state S320 — Collect detection value from each of first sensor, second sensor and third sensor at first sampling rate S322 — Determine first abnormality index based on detection value collected from each of first sensor, second sensor and third sensor using first correlation function S330 — Is first abnormal situation is detected? — NO

YES

S340 — Collect detection value from each of first sensor, second sensor and third sensor at second sampling rate S342 — Determine second abnormality index based on detection value collected from each of first sensor, second sensor and third sensor using second correlation function S350 — Is second abnormal situation is detected? — NO

YES

S360 — Collect detection value from each of first sensor, second sensor and third sensor at third sampling rate S362 — Determine third abnormality index based on detection value collected from each of first sensor, second sensor and third sensor using third correlation function S370 — Is third abnormal situation is detected? — NO

YES

S380 — Perform predetermined safety function

End

BATTERY MONITORING DEVICE, BATTERY MONITORING METHOD, BATTERY PACK AND ELECTRIC VEHICLE

CROSS REFERENCE TO RELATED APPLICATIONS

The present application is a national phase entry under 35 U.S.C. § 371 of International Application No. PCT/KR2021/012985 filed Sep. 23, 2021 which claims priority to Korean Patent Application No. 10-2020-0135553 filed on Oct. 19, 2020 in the Republic of Korea, the disclosures of which are incorporated herein by reference.

TECHNICAL FIELD

The present disclosure relates to technology that monitors an internal abnormality of a battery assembly having a plurality of battery cells.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory, effect, and thus they are gaining more attention than nickel-based batteries for their advantages that recharging can be done whenever it is convenient, the self-discharge rate is very low and the energy density is high.

In general, a battery pack includes at least one battery assembly having a plurality of battery cells and a housing which accommodates the battery cells. The battery cell is manufactured by receiving an electrode stack and an electrolyte in a case, and sealing up the case. The case isolates the electrode assembly and the electrolyte from the external environment for safe use of the battery cell.

When the case of the battery cell is broken, hazardous materials (for example, the electrolyte solution) to human held inside by the case may leak out of the case. The cause of the case break may be classified into an external cause and an internal cause. Since the external cause (for example, strong external impacts) is difficult to predict, in the safe operation of the battery pack, it is necessary to focus on the internal cause.

The case break by the internal cause may occur in the following order. As the temperature of the battery cell rises, gas generation in the battery cell occurs faster, the internal pressure rises by the generated gas, and the case gradually expands. When the expansion of the case goes beyond the limit, eventually the case is broken and gas held in the case comes out of the case.

SUMMARY

Technical Problem

The present disclosure is designed to solve the above-described problem, and therefore the present disclosure is directed to providing an apparatus and method for monitoring an internal abnormality of a battery assembly using sensors which independently detect the parameters (i.e., temperature, pressure, gas) associated with the case break of a battery cell included in the battery assembly, a battery pack comprising the apparatus, and an electric vehicle comprising the battery pack.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery monitoring apparatus according to an aspect of the present disclosure is for a battery assembly having a housing and a plurality of battery cells in the housing. The battery monitoring apparatus includes a first sensor configured to detect an internal temperature of the housing; a second sensor configured to detect an internal pressure of the housing; a third sensor configured to detect an internal gas of the housing; a power circuit configured to generate an operating voltage using a direct current power of the battery assembly; and a controller configured to change the first sensor, the second sensor and the third sensor from an idle state to a wake-up state using the operating voltage when a monitor start command is received while the first sensor, the second sensor and the third sensor are in the idle state. The controller is configured to monitor an internal abnormality of the battery assembly based on a first detection value collected from the first sensor, a second detection value collected from the second sensor and a third detection value collected from the third sensor in the wake-up state.

When the monitor start command is received, the controller may be configured to collect the first detection value from the first sensor at a first sampling rate, collect the second detection value from the second sensor at a second sampling rate, and collect the third detection value from the third sensor at a third sampling rate.

The controller may be configured to determine a first abnormal situation in response to the first detection value collected from the first sensor being equal to or larger than a first threshold, the second detection value collected from the second sensor being less than a second threshold, and the third detection value collected from the third sensor being less than a third threshold, and in response to determination of the first abnormal situation, the controller may be configured to collect the first detection value from the first sensor at a fourth sampling rate which is equal to or less than the first sampling rate, collect the second detection value from the second sensor at a fifth sampling rate which is larger than the second sampling rate, and collect the third detection value from the third sensor at a sixth sampling rate which is equal to or larger than the third sampling rate.

The controller may be configured to determine a second abnormal situation in response to the second detection value collected from the second sensor being equal to or larger than the second threshold, and the third detection value collected from the third sensor being less than the third threshold, and in response to determination of the second abnormal situation, the controller may be configured to collect the first detection value from the first sensor at a seventh sampling rate which is equal to or less than the fourth sampling rate, collect the second detection value from the second sensor at an eighth sampling rate which is equal to or less than the fifth sampling rate, and collect the third detection value from the third sensor at a ninth sampling rate which is larger than the sixth sampling rate.

The controller may be configured to determine a third abnormal situation in response to the third detection value collected from the third sensor being equal to or higher than the third threshold and perform a predetermined safety function in response to determination of the third abnormal situation.

The controller may be configured to collect the first detection value from the first sensor, the second detection value from the second sensor and the third detection value from the third sensor in the wake-up state at a first sampling rate when the monitor start command is received.

The controller may be configured to determine a first abnormality index by applying a first correlation function to each of the first detection value collected from the first sensor, the second detection value collected from the second sensor and the third sensor. The controller may be configured to collect the first detection value from the first sensor, the second detection value from the second sensor and the third detection value from the third sensor at a second sampling rate which is larger than the first sampling rate when a first abnormal situation is determined, wherein the first abnormal situation is determined when the first abnormality index is equal to or larger than a first threshold index.

The controller may be configured to determine a second abnormality index by applying a second correlation function to each of the first detection value collected from the first sensor, the second detection value collected from the second sensor and the third detection value collected from the third sensor. The controller may be configured to collect the first detection value from the first sensor, the second detection value from the second sensor and the third detection value from the third sensor at a third sampling rate which is larger than the second sampling rate when a second abnormal situation is determined, wherein the second abnormal situation is determined when the second abnormality index is equal to or larger than a second threshold index. A second weight assigned to the second detection value collected from the second sensor in the second correlation function is larger than a first weight assigned to the second detection value collected from the second sensor in the first correlation function.

The controller may be configured to determine a third abnormality index by applying a third correlation function to the first detection value collected from the first sensor, the second detection value collected from the second sensor and the third detection value collected from the third sensor. The controller may be configured to perform a predetermined safety function when a third abnormal situation is determined, wherein the third abnormal situation is determined when the third abnormality index is equal to or larger than a third threshold index. A fourth weight assigned to the third detection value collected from the third sensor in the third correlation function is larger than a third weight assigned to the third detection value collected from the third sensor in the second correlation function.

A battery pack according to another aspect of the present disclosure may include the battery monitoring apparatus.

An electric vehicle according to still another aspect of the present disclosure may include the battery pack.

A battery monitoring method according to yet another aspect of the present disclosure is executable by a battery monitoring apparatus including a first sensor configured to detect an internal temperature of a housing of a battery assembly in which a plurality of battery cells is received; a second sensor configured to detect an internal pressure of the housing; a third sensor configured to detect an internal gas of the housing; a power circuit configured to generate an operating voltage using a direct current power from the battery assembly; and a controller. The battery monitoring method includes changing, by the controller, the first sensor, the second sensor and the third sensor from an idle state to a wake-up state using the operating voltage when a monitor start command is received while the first sensor, the second sensor and the third sensor are in the idle state; and monitoring, by the controller, an internal abnormality of the battery assembly based on a first detection value collected from the first sensor, a second detection value collected from the second sensor and a third detection value collected from the third sensor in the wake-up state.

Advantageous Effects

According to at least one of the embodiments of the present disclosure, an internal abnormality of the battery assembly may be monitored using the sensors which independently detect the parameters (i.e., temperature, pressure, gas) associated with the case break of the battery cell included in the battery assembly.

According to at least one of the embodiments of the present disclosure, the sampling rate of at least one sensor may be adjusted according to the severity of the abnormal situation corresponding to the detection value collected from each sensor, thereby quickly detecting the internal abnormality of the battery assembly, and reducing unnecessary consumption of power required to monitor the internal abnormality of the battery assembly.

The effects of the present disclosure are not limited to the effects mentioned above, and these and other effects will be clearly understood by those skilled in the art from the appended claims.

DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 3 is a flowchart illustrating exemplarily a battery monitoring method according to a second embodiment of the present disclosure.

DETAILED DESCRIPTION

Figure 1:
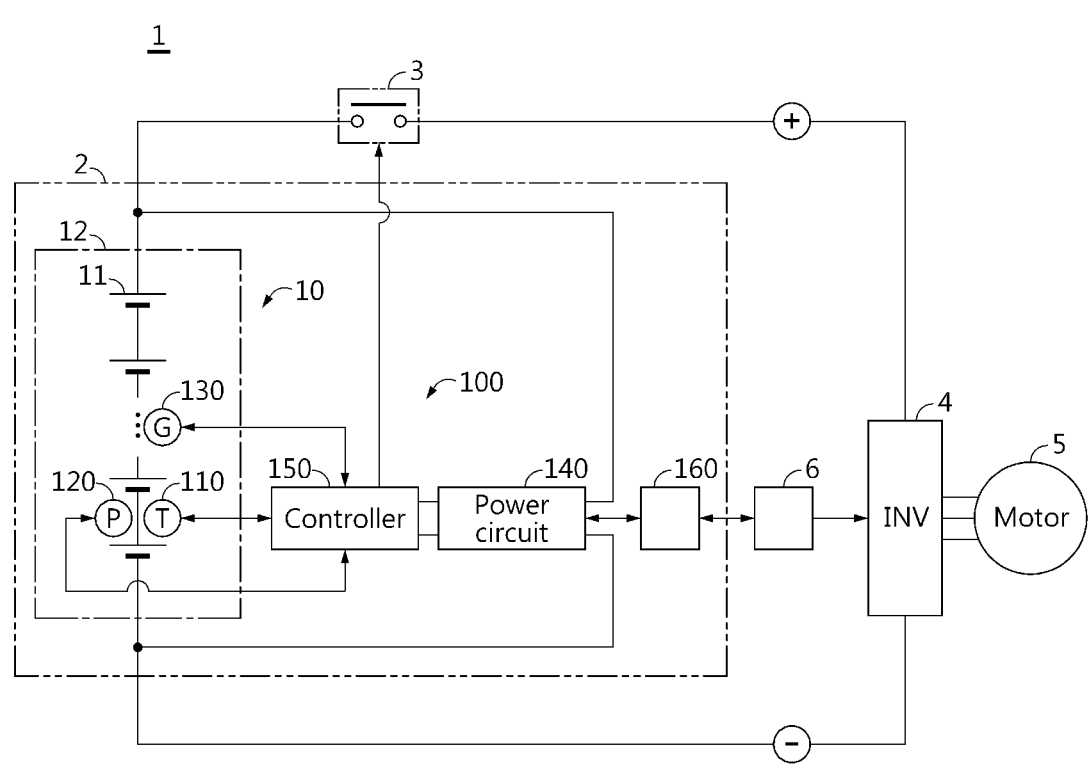
FIG. 1 is a diagram illustrating exemplarily a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram illustrating exemplarily a configuration of an electric vehicle 1 according to the present disclosure.

Referring to FIG. 1, the electric vehicle 1 includes a battery pack 2, a relay 3, an inverter 4, an electric motor 5 and a high-level controller 6.

The battery pack 2 includes a battery assembly 10 and a battery monitoring apparatus 100.

The relay 3 is electrically connected in series to the battery assembly 10 through a pair of power paths connecting each of the plus terminal and the minus terminal of the battery assembly 10 to each of the plus terminal and the minus terminal of the inverter 4. The relay 3 is controlled between an on state and an off state in response to a switching signal from the battery monitoring apparatus 100. The relay 3 may be a mechanical relay which is turned on/off by the electromagnetic force of a coil, a semiconductor switch such as a Metal Oxide Semiconductor Field Effect transistor (MOSFET).

The inverter 4 is provided to change the direct current (DC) power from the battery assembly 10 to alternating current (AC) power in response to a command from the high-level controller 6.

The electric motor 5 works using the AC power from the inverter 4. The electric motor 5 may be, for example, a three-phase AC motor.

The battery assembly 10 includes a plurality of battery cells 11 and a housing 12. The housing 12 defines the entire shape of the battery assembly 10, and provides an internal space in which the plurality of battery cells 11 may be placed (received). The housing 12 may be fixed and fastened to a battery room provided in the electric vehicle 1 through bolts.

The plurality of battery cells 11 may be connected either in series or in parallel or both. The battery cell 11 may include, for example, a lithium ion battery cell. The battery cell 11 is not limited to a particular type, and may include any type of battery cell that can be repeatedly recharged.

The battery cell 11 includes an electrode stack, an electrolyte and a case. The electrode stack includes a positive electrode plate, a negative electrode plate and a separator interposed between the positive electrode plate and the negative electrode plate. The case in which the electrode stack and the electrolyte are received therein is completely sealed up. Accordingly, so long as the case is unbroken, the electrode stack, the electrolyte and gas produced as a charge/discharge reaction by-product are isolated from the external environment by the case.

The battery monitoring apparatus 100 is provided to monitor the internal abnormality of the battery assembly 10 using the detection results of the internal temperature, the internal pressure and the internal gas of the battery assembly 10.

The battery monitoring apparatus 100 includes a first sensor 110, a second sensor 120, a third sensor 130, a power circuit 140 and a controller 150. The battery monitoring apparatus 100 may further include an interface unit 160.

The first sensor 110 is positioned in the internal space of the housing 12, and is configured to generate a first detection signal indicating the internal temperature of the battery assembly 10. For example, the first sensor 110 may detect the temperature between any two of the plurality of battery cells 11 as the internal temperature of the battery assembly 10. The first sensor 110 may include a well-known temperature detection device such as a thermistor and a thermocouple.

The second sensor 120 is positioned in the internal space of the housing 12, and is configured to generate a second detection signal indicating the internal pressure of the battery assembly 10. For example, the second sensor 120 may detect the pressure applied by the expansion of any two of the plurality of battery cells 11 in contact with each other as the internal pressure of the battery assembly 10. The second sensor 120 may include a well-known pressure detection device such as a strain gauge.

The third sensor 130 is positioned in the internal space of the housing 12, and is configured to generate a third detection signal indicating the internal gas of the battery assembly 10. The third sensor 130 may include a well-known gas detection device such as an air quality sensor.

The power circuit 140 is configured to generate the operating voltage having a predetermined voltage level required for the operation of the controller 150 using the DC power supplied from the battery assembly 10. The power circuit 140 may include a voltage regulator and a DC-DC converter.

The controller 150 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The controller 150 may include a memory embedded therein. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory may pre-store programs and data necessary to perform battery management methods according to embodiments as described below.

The controller 150 is operably coupled to the high-level controller 6, the first sensor 110, the second sensor 120, the third sensor 130 and the power circuit 140. Operably coupled refers to directly/indirectly connected to transmit and receive a signal in one or two directions.

The controller 150 is configured to collect a detection value from at least one of the first sensor 110, the second sensor 120 or the third sensor 130 while controlling the first sensor 110, the second sensor 120 and the third sensor 130 in response to a command from the high-level controller 6 during the operation using the operating voltage supplied by the power circuit 140. Collecting the detection value may refer to an operation of changing an analogue detection signal to a digital value and recording it in the memory.

The controller 150 may change the operating voltage to a power voltage that is different from the operating voltage using a voltage conversion circuit provided therein. The power voltage has a predetermined voltage level required for the activation of the first sensor 110, the second sensor 120 and the third sensor 130. That is, each of the first sensor 110, the second sensor 120 and the third sensor 130 operates in a wake-up state in which the associated detection signal is generated while the power voltage is being supplied. The controller 150 may change each sensor 110, 120, 130 from the wake-up state to an idle state by selectively interrupt the supply of the power voltage for each of the first sensor 110, the second sensor 120 and the third sensor 130. The generation of the detection signal associated with each sensor 110, 120, 130 controlled into the idle state is stopped. The first sensor 110, the second sensor 120 and the third sensor 130 may be also configured to be activated by the operating voltage, and in this case, the change from the operating voltage to the power voltage may be omitted.

The controller 150 may be operably coupled to each sensor 110, 120, 130 through a monitoring channel. The first monitoring channel has a power line and a communication line. The power voltage from the controller 150 may be supplied to each sensor 110, 120, 130 through the power line. The controller 150 may receive the detection signal from each sensor 110, 120, 130 through the communication line, and collect the received detection signal as the detection value.

The interface unit 160 is configured to support wired or wireless communication between the controller 150 and the high-level controller 6 (for example, an Electronic Control Unit (ECU)) of the electric vehicle 1. The wired communication may be, for example, controller area network (CAN) communication, and the wireless communication may be, for example, Zigbee or Bluetooth communication. The communication protocol is not limited to a particular type, and may include any communication protocol that supports the wired/wireless communication between the controller 150 and the high-level controller 6. The interface unit 160 may include an output device (for example, a display, a speaker) to provide the information received from the controller 150 and/or the high-level controller 6 in a recognizable format.

Figure 2:
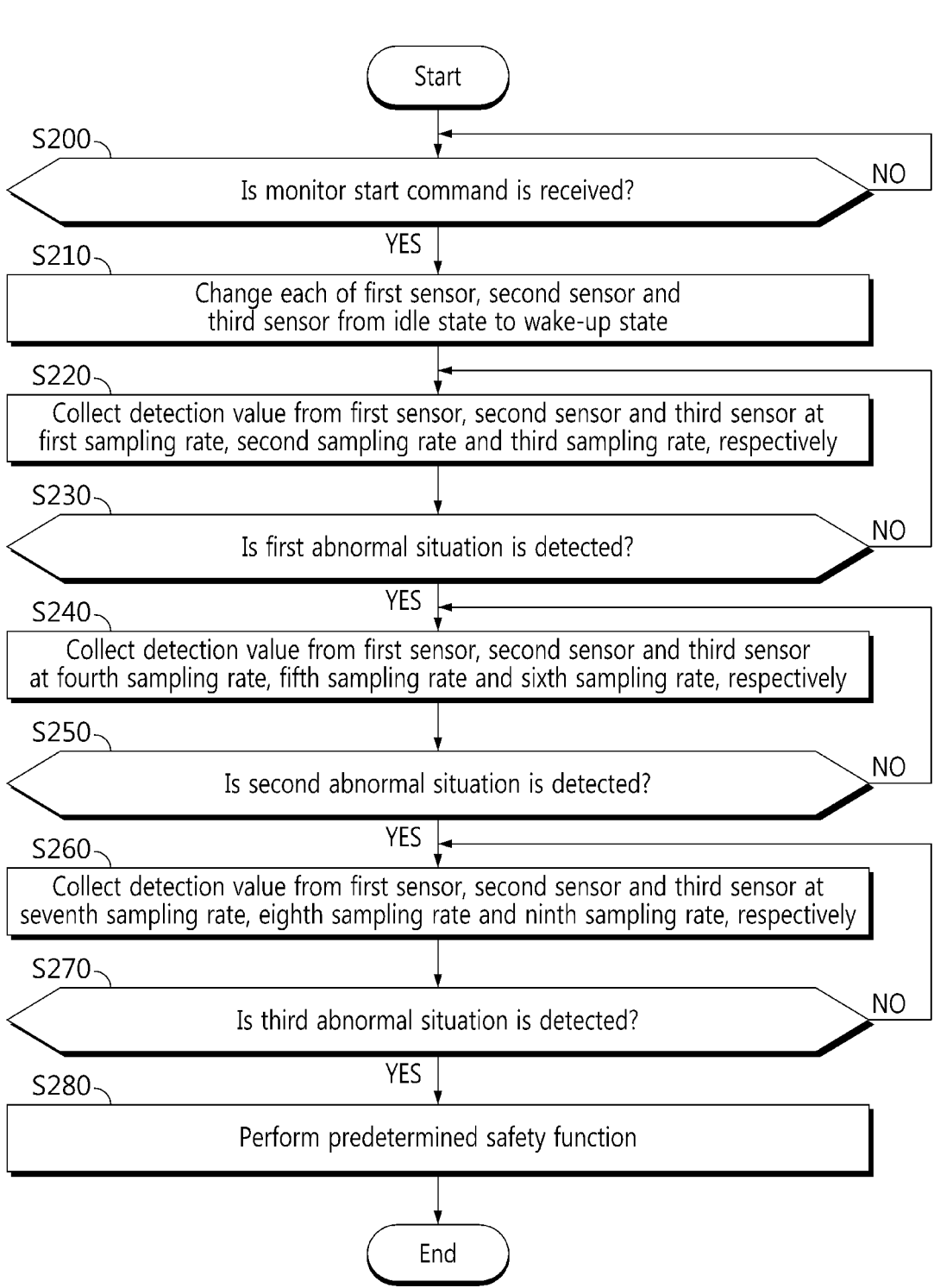
FIG. 2 is a flowchart illustrating exemplarily a battery monitoring method according to a first embodiment of the present disclosure.

FIG. 2 is a flowchart illustrating exemplarily a battery monitoring method according to a first embodiment of the present disclosure. The method of FIG. 2 may be performed by the battery monitoring apparatus 100 of FIG. 1.

Referring to FIGS. 1 and 2, in step S200, the controller 150 determines whether a monitor start command is received while the first sensor 110, the second sensor 120 and the third sensor 130 are being controlled into the idle state. The high-level controller 6 may transmit the monitor start command to the battery monitoring apparatus 100 in response to a user input. When a value of the step S200 is "YES", step S210 is performed.

In the step S210, the controller 150 changes the first sensor 110, the second sensor 120 and the third sensor 130 from the idle state to the wake-up state by the power supply to the first sensor 110, the second sensor 120 and the third sensor 130. Accordingly, each of the first sensor 110, the second sensor 120 and the third sensor 130 generates the detection signal in the wake-up state.

In step S220, the controller 150 collects detection values from the first sensor 110, the second sensor 120 and the third sensor 130 at a first sampling rate, a second sampling rate and a third sampling rate, respectively. The first sampling rate, the second sampling rate and the third sampling rate may be equal or different, and each has a preset value. For example, the first sampling rate may be 100 times/1 sec, the second sampling rate may be 10 times/1 sec, and the third sampling rate may be 1 time/1 sec.

In step S230, the controller 150 determines whether a first abnormal situation is detected, the first abnormal situation in which the detection value collected from the first sensor 110 is equal to or larger than a first threshold, the detection value collected from the second sensor 120 is less than a second threshold, and the detection value collected from the third sensor 130 is less than a third threshold. That is, the first abnormal situation is a situation in which the internal temperature of the battery assembly 10 rises above the threshold temperature corresponding to the first threshold, while both the internal pressure and the gas concentration of the battery assembly 10 are at the normal level. When a value of the step S230 is "YES", step S240 is performed.

In the step S240, the controller 150 collects detection values from the first sensor 110, the second sensor 120 and the third sensor 130 at a fourth sampling rate, a fifth sampling rate and a sixth sampling rate, respectively. That is, the controller 150 sets the acquisition rate of the first detection signal from the first sampling rate to the fourth sampling rate, the acquisition rate of the second detection signal from the second sampling rate to the fifth sampling rate, and the acquisition rate of the third detection signal from the third sampling rate to the sixth sampling rate, respectively. Each of the fourth sampling rate, the fifth sampling rate and the sixth sampling rate has a preset value. The fourth sampling rate is equal to or less than the first sampling rate. The fifth sampling rate is larger than the second sampling rate. The sixth sampling rate is equal to or larger than the third sampling rate. For example, the fourth sampling rate may be 100 times/1 sec, the fifth sampling rate may be 50 times/1 sec, and the sixth sampling rate may be 60 times/1 sec. Since the fifth sampling rate is larger than the second sampling rate, it is possible to precisely monitor the internal pressure increasing with the increasing internal temperature.

In step S250, the controller 150 determines whether a second abnormal situation is detected, the second abnormal situation in which the detection value collected from the second sensor 120 is equal to or larger than the second threshold, and the detection value collected from the third sensor 130 is less than the third threshold. Since the first abnormal situation has been already detected, the detection value collected from the first sensor 110 may not be used to determine whether the second abnormal situation occurred. That is, the second abnormal situation is a situation in which after the internal temperature of the battery assembly 10 rises above the threshold temperature corresponding to the first threshold, the internal pressure of the battery assembly 10 rises above the threshold pressure corresponding to the second threshold, and the gas concentration of the battery assembly 10 is at the normal level. When a value of the step S250 is "YES", step S260 is performed.

In the step S260, the controller 150 collects detection values from the first sensor 110, the second sensor 120 and the third sensor 130 at a seventh sampling rate, an eighth sampling rate and a ninth sampling rate, respectively. That is, the controller 150 sets the acquisition rate of the first detection signal from the fourth sampling rate to the seventh sampling rate, the acquisition rate of the second detection signal from the fifth sampling rate to the eighth sampling rate, and the acquisition rate of the third detection signal from the sixth sampling rate to the ninth sampling rate, respectively. Each of the seventh sampling rate, the eighth sampling rate and the ninth sampling rate has a preset value. The seventh sampling rate is equal to or less than the fourth sampling rate. The eighth sampling rate is equal to or less than the fifth sampling rate. The ninth sampling rate is larger than the sixth sampling rate. For example, the seventh sampling rate may be 60 times/1 sec, the eighth sampling rate may be 50 times/1 sec, and the ninth sampling rate may be 100 times/1 sec. Since the ninth sampling rate is larger than the sixth sampling rate, it is possible to precisely monitor gas leakage that occurs when the case is broken due to the rise in the internal pressure.

In step S270, the controller 150 determines whether a third abnormal situation is detected, the third abnormal situation in which the detection value collected from the third sensor 130 is equal to or larger than the third threshold. Since the first abnormal situation and the second abnormal situation have been already detected, the detection value collected from the first sensor 110 and the detection value collected from the second sensor 120 may not be used to determine whether the second abnormal situation occurred. That is, the third abnormal situation is a situation in which after the internal pressure of the battery assembly 10 rises above the threshold pressure corresponding to the second threshold, the gas concentration in the housing 12 exceeds the normal level due to the case break of at least one battery cell 11 included in the battery assembly 10. When a value of the step S270 is "YES", step S280 is performed.

In the step S280, the controller 150 performs a predetermined safety function. The safety function may include an operation of reporting the case break to the high-level controller 6. The safety function may include an operation of controlling the relay 3 into the off state. The safety function may include an operation of outputting visual/auditory information notifying the case break to the user (for example, a vehicle driver).

FIG. 3 is a flowchart illustrating exemplarily a battery monitoring method according to a second embodiment of the present disclosure. The method of FIG. 3 may be performed by the battery monitoring apparatus 100 of FIG. 1.

Referring to FIGS. 1 and 3, in step S300, the controller 150 determines whether a monitor start command is received while the first sensor 110, the second sensor 120 and the third sensor 130 is being controlled into the idle state. The high-level controller 6 may transmit the monitor start command to the battery monitoring apparatus 100 in response to a user input. When a value of the step S300 is "YES", step S310 is performed.

In the step S310, the controller 150 changes the first sensor 110, the second sensor 120 and the third sensor 130 from the idle state to the wake-up state by the power supply to the first sensor 110, the second sensor 120 and the third sensor 130. Accordingly, each of the first sensor 110, the second sensor 120 and the third sensor 130 generates the detection signal in the wake-up state.

In step S320, the controller 150 collects detection values from each of the first sensor 110, the second sensor 120 and the third sensor 130 at the first sampling rate. The first sampling rate has a preset value. For example, the first sampling rate may be 3 times/1 sec.

In step S322, the controller 150 determines a first abnormality index indicating the severity of the internal abnormality of the battery assembly 10 based on the detection values collected from each of the first sensor 110, the second sensor 120 and the third sensor 130 using a first correlation function. The first correlation function is a function which outputs a combination of the results of applying a weight (a conversion coefficient) unique to each collected detection value to each of the detection value from the first sensor 110, the detection value from the second sensor 120 and the detection value from the third sensor 130. The following Equation 1 is an example of the first correlation function.

$$DI_1 = (C_1 \times S_1) + (C_2 \times S_3) \qquad \text{<Equation 1>}$$

In Equation 1, $DI_1$ is the first abnormality index, $C_1$ is the first conversion coefficient, $C_2$ is the second conversion coefficient, $C_3$ is the third conversion coefficient, $S_1$ is the latest detection value collected from the first sensor 110, $S_2$ is the latest detection value collected from the second sensor 120, and $S_3$ is the latest detection value collected from the third sensor 130. The first correlation function is not limited to Equation 1 according the above example, and may include any other equation which outputs the result of combining the detection values of each sensor 110, 120, 130.

In step S330, the controller 150 determines whether a first abnormal situation is detected, the first abnormal situation in which the first abnormality index is equal to or larger than a first threshold index. The first abnormal situation is a situation in which the battery assembly 10 is not normal, but the likelihood that the case of the battery cell 11 may be broken is equal to or less than a predetermined level. When a value of the step S330 is "YES", step S340 is performed.

In the step S340, the controller 150 collects detection values from each of the first sensor 110, the second sensor 120 and the third sensor 130 at the second sampling rate which is larger than the first sampling rate. That is, the controller 150 increases the acquisition rate of the first detection signal, the acquisition rate of the second detection signal and the acquisition rate of the third detection signal from the first sampling rate to the second sampling rate. For example, the second sampling rate may be 30 times/1 sec.

In step S342, the controller 150 determines a second abnormality index indicating the severity of the internal abnormality of the battery assembly 10 based on the detection values collected from each of the first sensor 110, the second sensor 120 and the third sensor 130 using a second correlation function. The second correlation function is a function which outputs a combination of the results of applying a weight (a conversion coefficient) unique to each collected detection value to each of the detection value from the first sensor 110, the detection value from the second sensor 120 and the detection value from the third sensor 130. The following Equation 2 is an example of the second correlation function.

$$DI_2 = (C_4 \times S_1) + (C_5 \times S_2) + (C_6 \times S_3) \qquad \text{<Equation 2>}$$

In Equation 2, $DI_2$ is the second abnormality index, $C_4$ is the fourth conversion coefficient, $C_5$ is the fifth conversion coefficient, $C_6$ is the sixth conversion coefficient, S is the latest detection value collected from the first sensor 110, $S_2$ is the latest detection value collected from the second sensor 120, and $S_3$ is the latest detection value collected from the third sensor 130. The second correlation function is not limited to Equation 2 according to the above example, and may include any other equation which outputs the result of combining the detection values of each sensor 110, 120, 130.

It should be noted that the weight assigned to the detection value collected from the second sensor 120 by the second correlation function may be larger than the weight assigned to the detection value collected from the second sensor 120 by the first correlation function. For example, the fifth conversion coefficient $C_5$ of Equation 2 is larger than the second conversion coefficient $C_2$ of Equation 1.

In step S350, the controller 150 determines whether a second abnormal situation is detected, the second abnormal situation in which the detection value collected from the second sensor 120 is equal to or larger than a second threshold index, and the detection value collected from the third sensor 130 is less than a third threshold index. The second abnormal situation is a situation in which the likelihood that the case of the battery cell 11 may be broken exceeds a predetermined level due to the severer internal abnormality of the battery assembly 10 than the first abnormal situation. When a value of the step S350 is "YES", step S360 is performed.

In the step S360, the controller 150 collects detection values from each of the first sensor 110, the second sensor 120 and the third sensor 130 at the third sampling rate which is larger than the second sampling rate. That is, the controller 150 increases the acquisition rate of the first detection signal, the acquisition rate of the second detection signal and the acquisition rate of the third detection signal from the second sampling rate to the third sampling rate. For example, the third sampling rate may be 60 times/1 sec.

In step S362, the controller 150 determines a third abnormality index indicating the severity of the internal abnormality of the battery assembly 10 based on the detection values collected from each of the first sensor 110, the second sensor 120 and the third sensor 130 using a third correlation function. The third correlation function is a function which outputs a combination of the results of applying a weight (a conversion coefficient) unique to each collected detection value to each of the detection value from the first sensor 110, the detection value from the second sensor 120 and the detection value from the third sensor 130. The following Equation 3 is an example of the third correlation function.

$$DI_3 = (C_7 \times S_1) + (C_8 \times S_2) + (C_9 \times S_3) \qquad \text{<Equation 3>}$$

In Equation 3, $DI_3$ is the third abnormality index, $C_7$ is the seventh conversion coefficient, $C_8$ is the eighth conversion coefficient, $C_9$ is the ninth conversion coefficient, $S_1$ is the latest detection value collected from the first sensor 110, $S_2$ is the latest detection value collected from the second sensor 120, and $S_3$ is the latest detection value collected from the third sensor 130. The third correlation function is not limited to Equation 3 according to the above example, and may include any other equation that outputs the result of combining the detection values of each sensor 110, 120, 130.

It should be noted that the weight assigned to the detection value collected from the third sensor 130 by the third correlation function may be larger than the weight assigned to the detection value collected from the third sensor 130 by the second correlation function. For example, the ninth conversion coefficient $C_9$ of Equation 3 is larger than the sixth conversion coefficient $C_6$ of Equation 2.

In step S370, the controller 150 determines whether a third abnormal situation is detected, the third abnormal situation in which the detection value collected from the third sensor 130 is equal to or larger than the third threshold index. When a value of the step S370 is "YES", step S380 is performed.

In the step S380, the controller 150 performs a predetermined safety function. The safety function may include an operation of reporting the case break to the high-level controller 6. The safety function may include an operation of controlling the relay 3 into the off state. The safety function may include an operation of outputting visual/auditory information notifying the case break to the user (for example, a vehicle driver).

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery monitoring apparatus for a battery assembly having a housing and a plurality of battery cells in the housing, the battery monitoring apparatus comprising:

a first sensor configured to detect an internal temperature of the housing;

a second sensor configured to detect an internal pressure of the housing;

a third sensor configured to detect an internal gas of the housing;

a power circuit configured to generate an operating voltage using a direct current power of the battery assembly; and a controller configured to change the first sensor, the second sensor and the third sensor from an idle state to a wake-up state using the operating voltage when a monitor start command is received while the first sensor, the second sensor and the third sensor are in the idle state, wherein the controller is configured to:

monitor an internal abnormality of the battery assembly based on a first detection value collected from the first sensor, a second detection value collected from the second sensor and a third detection value collected from the third sensor in the wake-up state;

in a first stage, determine a first abnormal situation based on the first detection value, the second detection value and the third detection value;

in a second stage after the determination of the first abnormal situation, determine a second abnormal situation based on the second detection value and the third detection value;

in a third stage after the determination of the second abnormal situation, determine a third abnormal situation based on the third detection value; and determine an internal abnormality of the battery assembly based on the determination of the third abnormal situation.

2. The battery monitoring apparatus according to claim 1, wherein the controller is configured to:

when the monitor start command is received, collect the first detection value from the first sensor at a first sampling rate, collect the second detection value from the second sensor at a second sampling rate, and collect the third detection value from the third sensor at a third sampling rate.

3. The battery monitoring apparatus according to claim 2, wherein the controller is configured to:

determine the first abnormal situation in response to the first detection value collected from the first sensor being equal to or larger than a first threshold, the second detection value collected from the second sensor being less than a second threshold, and the third detection value collected from the third sensor being less than a third threshold, and in response to determination of the first abnormal situation:

collect the first detection value from the first sensor at a fourth sampling rate which is equal to or less than the first sampling rate, collect the second detection value from the second sensor at a fifth sampling rate which is larger than the second sampling rate, and collect the third detection value from the third sensor at a sixth sampling rate which is equal to or larger than the third sampling rate.

4. The battery monitoring apparatus according to claim 3, wherein the controller is configured to:

determine the second abnormal situation in response to the second detection value collected from the second sensor being equal to or larger than the second threshold, and the third detection value collected from the third sensor being less than the third threshold, and in response to determination of the second abnormal situation:

collect the first detection value from the first sensor at a seventh sampling rate which is equal to or less than the fourth sampling rate, collect the second detection value from the second sensor at an eighth sampling rate which is equal to or less than the fifth sampling rate, and collect the third detection value from the third sensor at a ninth sampling rate which is larger than the sixth sampling rate.

5. The battery monitoring apparatus according to claim 4, wherein the controller is configured to:

determine the third abnormal situation in response to the third detection value collected from the third sensor being equal to or higher than the third threshold; and perform a predetermined safety function in response to determination of the third abnormal situation.

6. The battery monitoring apparatus according to claim 1, wherein the controller is configured to collect the first detection value from the first sensor, the second detection value from the second sensor and the third detection value from the third sensor in the wake-up state at a first sampling rate when the monitor start command is received.

7. The battery monitoring apparatus according to claim 6, wherein the controller is configured to:

determine a first abnormality index by applying a first correlation function to each of the first detection value collected from the first sensor, the second detection value collected from the second sensor and the third detection value collected from the third sensor, and collect the first detection value from the first sensor, the second detection value from the second sensor and the third detection value from the third sensor at a second sampling rate which is larger than the first sampling rate when a first abnormal situation is determined, wherein the first abnormal situation is determined when the first abnormality index is equal to or larger than a first threshold index.

8. The battery monitoring apparatus according to claim 7, wherein the controller is configured to:

determine a second abnormality index by applying a second correlation function to each of the first detection value collected from the first sensor, the second detection value collected from the second sensor and the third detection value collected from the third sensor, and collect the first detection value from the first sensor, the second detection value from the second sensor and the third detection value from the third sensor at a third sampling rate which is larger than the second sampling rate when a second abnormal situation is determined, wherein the second abnormal situation is determined when the second abnormality index is equal to or larger than a second threshold index, wherein a second weight assigned to the second detection value collected from the second sensor in the second correlation function is larger than a first weight assigned to the second detection value collected from the second sensor in the first correlation function.

9. The battery monitoring apparatus according to claim 8, wherein the controller is configured to:

determine a third abnormality index by applying a third correlation function to the first detection value collected from the first sensor, the second detection value collected from the second sensor and the third detection value collected from the third sensor, and perform a predetermined safety function when a third abnormal situation is determined, wherein the third abnormal situation is determined when the third abnormality index is equal to or larger than a third threshold index, wherein a fourth weight assigned to the third detection value collected from the third sensor in the third correlation function is larger than a third weight assigned to the third detection value collected from the third sensor in the second correlation function.

10. A battery pack comprising the battery monitoring apparatus according to claim 1.

11. An electric vehicle comprising the battery pack according to claim 10.

12. The battery monitoring apparatus according to claim 1, wherein the controller is configured to adjust a sampling rate of the first detection value, a sampling rate of the second detection value, and a sampling rate of the third detection value based on whether the controller is operating in the first, second or third stage.

13. A battery monitoring method which is executable by a battery monitoring apparatus including a first sensor configured to detect an internal temperature of a housing of a battery assembly in which a plurality of battery cells is received; a second sensor configured to detect an internal pressure of the housing; a third sensor configured to detect an internal gas of the housing; a power circuit configured to generate an operating voltage using a direct current power from the battery assembly; and a controller, the battery monitoring method comprising:

changing, by the controller, the first sensor, the second sensor and the third sensor from an idle state to a wake-up state using the operating voltage when a monitor start command is received while the first sensor, the second sensor and the third sensor are in the idle state;

monitoring, by the controller, an internal abnormality of the battery assembly based on a first detection value collected from the first sensor, a second detection value collected from the second sensor and a third detection value collected from the third sensor in the wake-up state;

determining, by the controller, in a first stage, a first abnormal situation based on the first detection value, the second detection value and the third detection value;

determining, by the controller, in a second stage after the determination of the first abnormal situation, a second abnormal situation based on the second detection value and the third detection value;

determining, by the controller, in a third stage after the determination of the second abnormal situation, a third abnormal situation based on the third detection value; and determining, by the controller, the internal abnormality of the battery assembly based on the determination of the third abnormal situation.

\* \* \* \* \*